United States Patent [19]

Boldridge, Jr.

[11] 4,348,638
[45] Sep. 7, 1982

[54] POWER MEASURING APPARATUS

[75] Inventor: Austin G. Boldridge, Jr., Freehold, N.J.

[73] Assignee: Conversational Systems, Inc., New York, N.Y.

[21] Appl. No.: 143,377

[22] Filed: Apr. 24, 1980

Related U.S. Application Data

[62] Division of Ser. No. 925,105, Jul. 17, 1978, Pat. No. 4,236,112.

[51] Int. Cl.³ .......................... G01R 1/20; H01F 27/30
[52] U.S. Cl. ...................................... 324/127; 336/20; 336/208
[58] Field of Search ............... 324/127, 117 R, 117 H, 324/158 P; 336/20, 173, 174, 175, 208, 229; 9/340

[56] References Cited

U.S. PATENT DOCUMENTS

| | | | |
|---|---|---|---|
| 2,950,489 | 8/1960 | Pattison | 9/340 |
| 3,434,052 | 3/1969 | Fechant | 324/127 |
| 4,161,692 | 7/1979 | Tarzwell | 324/158 P |

*Primary Examiner*—Ernest F. Karlsen
*Attorney, Agent, or Firm*—Hane, Roberts, Spiecens & Cohen

[57] ABSTRACT

Apparatus for measuring power consumed by a load connected via mains to a source of alternating current having a given fundamental frequency includes means for generating a first signal proportional to the instantaneous voltage across the load and a transformer secondary toroidally wrapped around one of the mains for generating a second signal proportional to the instantaneous current through the load. Tuned amplifiers of narrow band pass amplify the signals before they are fed to a square low multiplier means including photooptical devices.

1 Claim, 4 Drawing Figures

POWER MEASURING APPARATUS

This is a divisional of application Ser. No. 925,105 filed July 17, 1978 now U.S. Pat. No. 4,236,112 issued Nov. 25, 1980.

BACKGROUND OF THE INVENTION

This invention pertains to power measuring apparatus and more particularly to such apparatus for measuring power drawn for local utilities.

One of the problems of AC power measurement in existing power installations, requiring the measurement of AC current, is that of overcoming the physical size limitations of a pick-up transducer. Very little space is available in switching/breaker boxes or terminals for the addition of current transformers. Further, the problem of using non-technical personnel to install such devices requires simplicity of the task and built-in safety features regarding installation. Finally, the transducer must be inexpensive, reliable and reasonably precise from a physical measurement point of view to be useful.

In order to attain measurement errors not exceeding ±0.25% full-scale using ferromagnetic core materials in a current transformer, core dimensions would approximately be 11"×8"×3" (outside) and would weigh in the order of 23 pounds, using the most efficient configuration . . . for 1000 amp RMS applications. Further, in order to meet such stringent accuracy requirements, the air-gap must be precisely held, and the core must be carefully oriented perpendicular to the primary feedthrough turn, which in turn must be placed at the geometrical center of the core.

On the other hand, the use of nonferrous cores has not been successful in the past because transformation efficiencies were considered to be too low at power frequencies.

Even when the transformer problem is solved current-voltage multipliers must be used. Heretofore people have proposed a combination logarithmic amplifiers and summing amplifiers or analog to digital converters with microprocessors. Either concept while workable is relatively expensive.

The idea to use Hall-effect devices has been proposed because they are efficient as multiplication devices. However, the application of a current sensors is impractical since flux concentrators must be employed.

Many years ago there were proposed square-law multipliers. Typical of these proposals are in U.S. Pat. No. 1,586,533 issued June 1, 1926 and "An Electron Tube Wattmeter and Voltmeter and Phase Shifting Bridge" Proc. IRE; vol. 30, October 1930 at page 1743. These proposals suffered from severe limitations and could not be realized with any amount of accuracy, reproducibility or economy.

BRIEF DESCRIPTION OF THE INVENTION

Briefly, the invention contemplates apparatus for measuring the power consumed by a load connected via mains to a source of alternating current having a given fundamental frequency. The apparatus includes means for generating a first signal proportional to the instantaneous voltage across the load and means for generating a second signal proportional to the instantaneous current through the load. Amplifier means tuned to the fundamental frequency narrow-band amplify the first and second signals. The outputs of the amplifiers are connected to the inputs of a square law multiplier means for generating an output signal whose amplitude is proportional to the product of the magnitudes of the first and second signals and the cosine of the phase angles between such signals.

BRIEF DESCRIPTION OF THE DRAWING

The objects, features and advantages of the invention will be apparent from the following detailed description when read with the accompanying drawing which shows by way of example, and not limitation, the presently preferred embodiment of the invention. In the drawing.

DESCRIPTION OF THE PREFERRED EMBODIMENT

Figure 1:
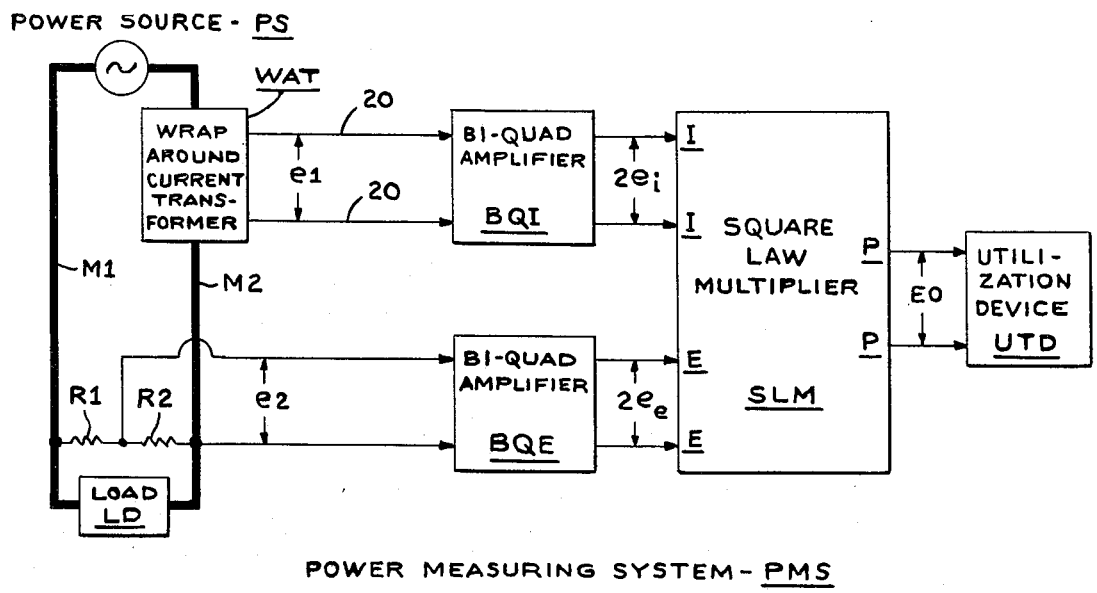
FIG. 1 is a block diagram of a power measuring system utilizing the invention.

In FIG. 1 the power measuring system PMS measures the power delivered from alternating current source PS via mains M1 and M2 to a load LD. In the usual circumstances, the power source PS is the local utility and load LD the customers facility connected to junction box. The customer may want to know the instantaneous power consumption in order to control his load's demand on the utility.

In order to determine the power consumption it is necessary to know the current through and the voltage across the load LD. A first signal e1 which is proportional the current through the load is preferably indicated by the wrap around transformer means WAT, hereinafter more fully described, which is wrapped around main M2. A signal e2 which is proportional to the voltage across the load LD can be generated by means of the high resistance resistors R1 and R2 acting as a voltage divider connected load LD. The voltage across R2 is the signal which is proportional to the load voltage. If direct contact cannot be made across the load, then capacitive sleeves could be used around each of the mains M1 and M2. Said sleeves form a capacitive voltage divider.

The signal e2 is fed to the input of bi-quad amplifier BQI; and the signal e2 is fed to a similar bi-quad amplifier BQE. These amplifiers which are hereinafter more fully described can be characterized as high gain (40 db) sharply tuned (Q of 50) band pass amplifiers centered around the frequency (60 Hz) of the power supply PS. The sharply filtered and amplified signals are respectively fed to inputs I and inputs E of square law multiplier SLM, hereinafter more fully described. A signal E0 which is a function of the instantaneous power is delivered from multiplier SLM which can be a meter, recorder, alarm or other device.

Figure 3:
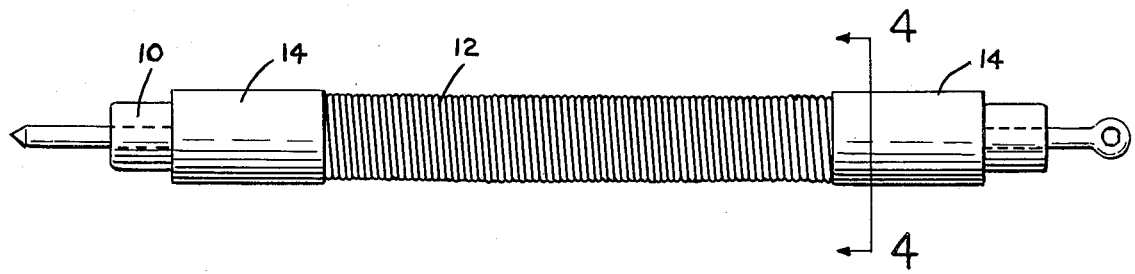
FIG. 3 is another side view of the secondary wrap around current transformer.
Figure 2:
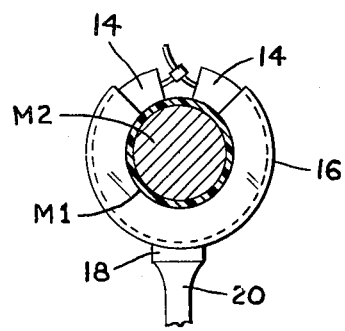
FIG. 2 is a side view of the secondary of the wrap around current transformer of FIG. 1.
Figure 4:
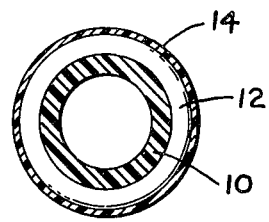
FIG. 4 is a cross section taken along the line 4—4 of FIG. 2.

The various components of the system will now be described in detail. In FIGS. 2, 3 and 4 there is shown the wrap around transformer WAT. The primary winding of the transformer is a "single turn" in the form of main M2 covered with insulation MI. The secondary winding of the transformer has a core in the form of a flexible hollow tube 10 of dielectric material such as soft polyethylene. Helically wound around the tube 10 are a plurality of turns of wire 12. The wire is held in place by keepers 14. The wire turns are preferably covered with a polyethylene coating 16. The ends of wire are connected to a pre-amplifier chip 18 directly mounted on the secondary winding. The output of the module is connected to multilead cable 20 which also carries an operating potential for the pre-amplifier chip.

Figure 5:
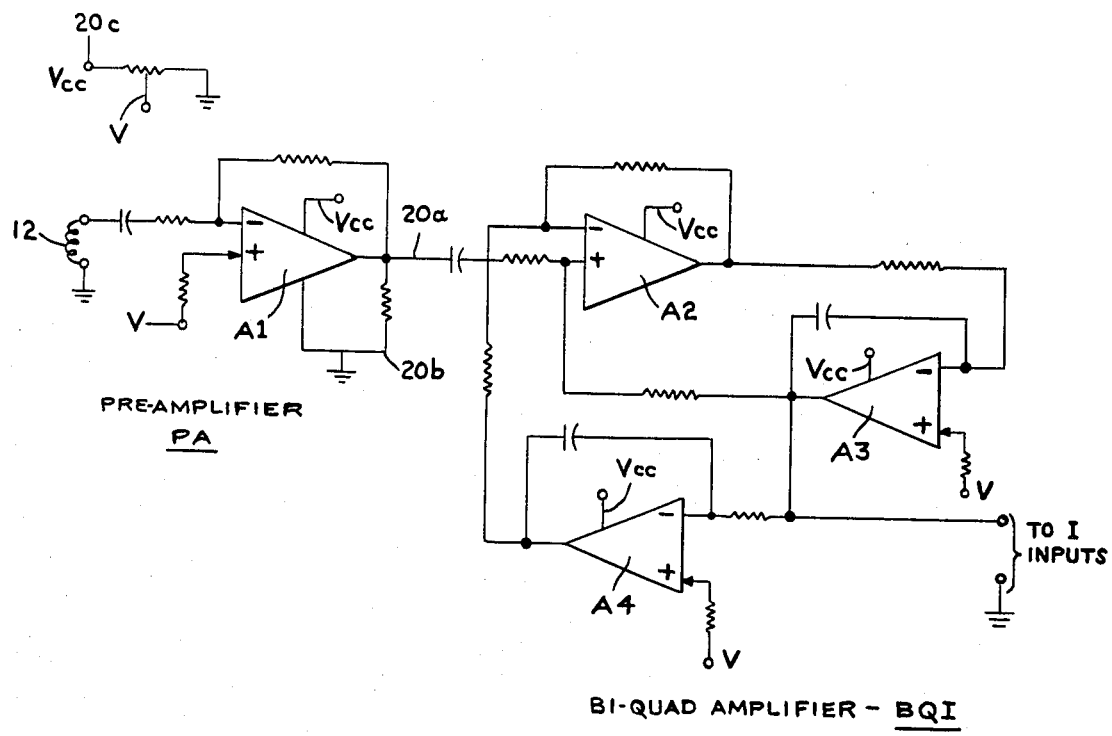
FIG. 5 is a schematic diagram of one of the bi-quad amplifiers of FIG. 1.

In FIG. 5 there is shown the circuit PA of the pre-amplifier chip 18 and the typical bi-quad amplifier BQI coupled thereto by means of lines 20A, 20B and 20C of cable 20. Although the pre-amplifier PA is disclosed as on the transformer secondary and the bi-quad amplifier remote therefrom, the invention contemplates the entire amplifier package to be on the transformer secondary. In any case, pre-amplifier can be a conventional high gain OP amplifier such as one of the amplifiers in a National Semiconductor device LM3900 or NS-324. The negative input (−) of the difference amplifier A1 is capacitor coupled to one end of winding 12 whose other end is grounded. The positive input (+) of the difference amplifier is coupled via a resistor to a reference voltage V.

The output of the pre-amplifier PA is capacitor coupled to the positive input (+) of the difference amplifier A2 of bi-quad amplifier BQI which includes two further difference amplifiers A3 and A4 acting as phase shifting feedback amplifiers to the respective inputs of amplifier A2 acting as a linear feedback amplifier. The output is taken from the junction of output of the phase shift amplifier A3 and the resistor connected to the negative input (−) of the phase shift amplifier A4 to provide an active bandpass amplifier. A further discussion and the design criteria can be found in Application Note AN72 entitled "The LM3900—A New Current-Differencing Quad of ± Input Amplifiers" in *Linear Applications* published by National Semiconductor Corporation Santa Clara, Ca. 95051.

Figure 6:
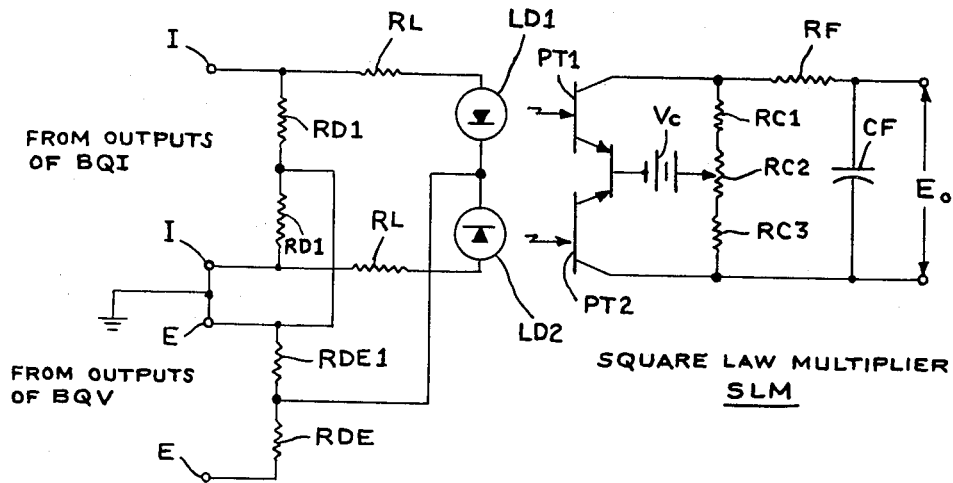
FIG. 6 is a schematic diagram of the square law multiplier of FIG. 1.

The square law multiplier SLM is shown in FIG. 6 centering around the light emitting diodes LD1 and LD2 optically coupled respectively to the bases of the phototransistors PT1 and PT2. In particular the cathodes of the diodes are interconnected while the anodes are connected via current limiting resistors RL to respective current input terminals I. Connected across the terminals I is a potential divider in the form of serially connected equivalued resistors RD. Connected across the voltage input terminals E is a potential divider in the form of serially connected resistors RDE and RDE1. One end of resistor RDE1 is connected to the junction of resistors RDI and the other end connected to the junction of the cathodes. If one assumes the instantaneous voltage developed across each resistor RDI is $e_i$ and the voltge developed across resistor RDE1 is $e_e$ then the voltage across diode LD1 is $e_i + e_e$ and the voltage across diode LD2 is $e_i - e_e$. This voltage causes square law currents to flow through the respective diodes which emit light in proportion thereto to the bases of phototransistors PT1 and PT2. The emitters of these transistors are interconnected to the negative terminal of a source of operating potential $V_c$ while the collectors are interconnected via serially connected resistors RC1, RC2 and RC3. Resistor RC2 is a balancing potentiometer whose tap is connected to the other terminal of source $V_c$. The voltage across these resistors is a function of $(e_i + e_e)^2 - (e_i - e_e)^2$ or $4e_i e_e$. With sinusoidal alternating currents, $e_i = A \sin \omega t$ and $e_e = B \sin \omega t + \theta$ then $4e_i e_e = KAB [\cos \theta - \cos (2\omega t + \theta)]$. This votage is then filtered by the filter comprising resistor RF and capacitor CF having a time constant greater than 0.05 sec for 60 Hz to yield within a fraction of a percent an output voltage $E0 = KAB \cos \theta$ where K is a constant, A and B the magnitudes of the current and voltage and $\theta$ the phase angle. Therefore, E0 represents the instantaneous power consumed by the load LD.

What is claimed is:

1. A transformer secondary winding comprising: a flexible hollow tube of dielectric material; a multiturn wire winding wound around the peripheral surface of said hollow tube; fastening means for interconnecting the ends of said hollow tube, said fastening means comprising a tape of flexible dielectric material passing through said hollow tube and extending beyond the ends thereof; and an integrated circuit amplifier affixed to said hollow tube and electrically connected to said winding.

* * * * *